(12) United States Patent
Cheng et al.

(10) Patent No.: US 6,927,988 B2
(45) Date of Patent: Aug. 9, 2005

(54) METHOD AND APPARATUS FOR MEASURING FAULT DIAGNOSTICS ON INSULATED GATE BIPOLAR TRANSISTOR CONVERTER CIRCUITS

(75) Inventors: Bing Cheng, West Bloomfield, MI (US); Kent M. Harmon, Troy, MI (US)

(73) Assignee: Ballard Power Systems Corporation, Dearborn, MI (US)

( * ) Notice: Subject to any disclaimer, the term of this patent is extended or adjusted under 35 U.S.C. 154(b) by 91 days.

(21) Appl. No.: 10/447,708

(22) Filed: May 28, 2003

(65) Prior Publication Data

US 2004/0034508 A1 Feb. 19, 2004

Related U.S. Application Data

(60) Provisional application No. 60/383,822, filed on May 28, 2002.

(51) Int. Cl.[7] .............................................. H02H 7/122
(52) U.S. Cl. .................................................... 363/56.04
(58) Field of Search ............................. 363/55, 56.02, 363/56.03, 56.04

(56) References Cited

U.S. PATENT DOCUMENTS

| | | | | |
|---|---|---|---|---|
| 4,126,819 A | * | 11/1978 | Stobbe et al. ................ | 318/810 |
| 4,371,824 A | * | 2/1983 | Gritter ......................... | 318/722 |
| 4,439,806 A | * | 3/1984 | Brajder ........................ | 361/98 |
| 4,617,622 A | * | 10/1986 | Fox .............................. | 363/98 |
| 4,739,465 A | * | 4/1988 | Asano et al. ............. | 363/56.04 |
| 4,777,579 A | * | 10/1988 | Jahns et al. .................... | 363/98 |
| 4,796,145 A | * | 1/1989 | Oshikiri ....................... | 361/57 |
| 4,819,157 A | * | 4/1989 | Hirose et al. ............ | 363/56.03 |
| 4,876,517 A | | 10/1989 | Arcus .......................... | 330/277 |
| 5,006,809 A | | 4/1991 | Mang et al. ................. | 324/715 |
| 5,063,338 A | * | 11/1991 | Capel et al. ................. | 318/685 |
| 5,111,378 A | * | 5/1992 | Nowak et al. ................ | 363/98 |
| 5,136,494 A | | 8/1992 | Akagi et al. ................... | 363/34 |
| 5,373,436 A | * | 12/1994 | Yamaguchi et al. ........... | 363/98 |
| 5,404,052 A | | 4/1995 | Lange .......................... | 327/109 |
| 5,455,502 A | | 10/1995 | Kato et al. ................... | 323/272 |
| 5,481,194 A | | 1/1996 | Schantz et al. ............. | 324/522 |
| 5,510,725 A | | 4/1996 | Schantz, Jr. et al. ........ | 324/768 |
| 5,569,966 A | | 10/1996 | Schantz, Jr. et al. ....... | 307/10.1 |
| 5,581,171 A | | 12/1996 | Kerfoot et al. ............... | 320/50 |
| 5,627,758 A | | 5/1997 | Lansberry et al. .......... | 364/481 |
| 5,804,868 A | | 9/1998 | Kobayashi et al. ......... | 257/630 |
| 5,811,957 A | | 9/1998 | Bose et al. .................. | 318/802 |
| 5,831,409 A | | 11/1998 | Lindberg et al. ............ | 318/801 |
| 5,929,665 A | * | 7/1999 | Ichikawa et al. ............ | 327/109 |
| 5,969,569 A | | 10/1999 | Marceau et al. ............ | 327/574 |
| 6,008,618 A | | 12/1999 | Bose et al. .................. | 318/811 |
| 6,056,384 A | | 5/2000 | Sato et al. ................... | 312/439 |
| 6,078,173 A | | 6/2000 | Kumar et al. ............. | 324/158.1 |
| 6,097,582 A | | 8/2000 | John et al. ..................... | 361/79 |
| 6,145,107 A | | 11/2000 | Farokhzad ................... | 714/745 |
| 6,160,726 A | * | 12/2000 | Mori et al. .................... | 363/98 |
| 6,169,649 B1 | | 1/2001 | Fasullo et al. .............. | 361/115 |
| 6,310,787 B2 | * | 10/2001 | Ito et al. ....................... | 363/34 |
| 6,570,780 B2 | * | 5/2003 | Furukawa et al. ............ | 363/98 |
| 6,704,212 B2 | * | 3/2004 | Furukawa et al. ............ | 363/41 |
| 6,760,237 B2 | * | 7/2004 | Tsuji et al. .................... | 363/55 |

* cited by examiner

Primary Examiner—Jeffrey Sterrett
(74) Attorney, Agent, or Firm—Seed IP Law Group PLLC

(57) ABSTRACT

A method for diagnosing faults using a load. In the method IGBTs are controlled such that certain currents are expected. If the currents are not as expected, a fault may be diagnosed.

38 Claims, 6 Drawing Sheets

US 6,927,988 B2

METHOD AND APPARATUS FOR MEASURING FAULT DIAGNOSTICS ON INSULATED GATE BIPOLAR TRANSISTOR CONVERTER CIRCUITS

CROSS-REFERENCE TO RELATED APPLICATION

This application claims the benefit of U.S. Provisional Patent Application No. 60/383,822, entitled "Method and Apparatus for Insulated Gate Bipolar Transistor Converter Circuit Fault Diagnostics," filed May 28, 2002, which is hereby incorporated herein by reference in its entirety.

BACKGROUND OF THE INVENTION

1. Field of the Invention

The present invention relates generally to the field of electronics, and more specifically to a method and an associated apparatus for measuring and diagnosing faulted insulated gate bipolar transistors ("IGBTs").

2. Description of the Related Art

The bipolar junction transistor ("BJT"), including its extension, the Darlington device, and the metal oxide semiconductor field effect transistor ("MOSFET") are commercially-available advanced electronics devices. Each device has characteristics that complement the other in some respects. Relative to MOSFETS, BJTs have lower conduction losses in the ON-state and larger blocking voltages, but also have lower switching speeds. In contrast, MOSFETs switch relatively faster, but have relatively larger conduction losses in the ON-state. In order to overcome these performance limitations of the BJT and the MOSFET, the IGBT was designed. This device has significantly superior characteristics for low and medium-frequency applications in comparison to the BJT and the MOSFET. Specifically, the IGBT is a voltage control device that can turn ON and OFF at a very high speed, and can deliver very high current compared to conventional bipolar transistors. Furthermore, its power rating can be improved by increasing both current and voltage. For this reason, IGBTs are preferred in some applications over both BJTs and MOSFETs.

IGBTs presently serve a number of traditional markets, including motor drives and welding applications. However, with the emergence of new market segments, it is expected that IGBTs will continue to be a growing part of other industries, such as the semiconductor industry. In particular, the automotive and power supply markets, including uninterruptible power supplies ("UPSs") and switch mode power supplies ("SPSs"), are expected to drive near term growth.

Due to the cost reduction and performance enhancement of the microprocessor, three-phase AC motor drives are becoming increasingly popular and may eventually replace conventional DC motor drives as the dominant motor drive. Presently, in the electric vehicle ("EV") field, almost all EVs, including hybrid electric vehicles ("HEVs") and fuel cell vehicles, use AC motor drives. One of the most important functions of the AC motor controller is to convert DC power to three-phase AC power. IGBTs are typically utilized to perform this conversion.

Referring to FIG. 1, there is illustrated the structure of a typical IGBT 1. This structure is very similar to that of a vertically-diffused MOSFET, featuring a double diffusion of a p-type region and an n-type region. An inversion layer may be formed under a gate 2 of the IGBT 1 by applying the correct voltage to the gate contact 3, much like a MOSFET. The main difference between the MOSFET and the IGBT is the use of a $p^+$ substrate layer in the IGBT for a drain. Because of this, the IGBT 1 becomes a bipolar device as the p-type region injects holes into the n-type region.

The gate voltage, $V_G$, controls the ON/OFF state of the IGBT 1. If the voltage applied to the gate contact 3 with respect to the emitter 4 is less than a threshold voltage, $V_{Th}$, then no MOSFET inversion layer is created and the device is turned OFF. In this instance, any applied forward voltage will fall across a reversed bias junction, $J_2$. The only current to flow will be a small leakage current.

To turn ON the IGBT 1, the gate voltage $V_G$ is increased to a point where it is greater than the threshold voltage $V_{Th}$. This results in an inversion layer forming under the gate 2, thereby providing a channel linking the source to the drift region of the IGBT 1. Electrons are then injected from the source into the drift region, while at the same time junction $J_3$, which is forward biased, injects holes into the $n^-$ doped drift region. Some of the injected holes will recombine in the drift region, while others will cross the drift region via diffusion and will reach the junction $J_3$ with the p-type region where they will be collected.

The p-type region exhibits a type of lateral resistance. If current flowing through this resistance is high enough, it will produce a voltage drop that will forward bias the junction with the $n^+$ region, turning ON a parasitic transistor that forms part of a parasitic thyristor. Once this happens, there is a high injection of electrons from the $n^+$ region into the p-type region, resulting in loss of all gate control. This is known as latch up, and usually leads to device destruction.

FIG. 2 is a circuit diagram illustrating a test structure 10 for performing diagnostics on IGBTs in a manufacturing facility. Six IGBTs, individually referenced as A+, A−, B+, B−, C+ and C−, are provided electrically coupled and drivable as a three-phase AC inverter 12, which is to be tested. The test structure 10 includes a voltage source $V_{dc}$, a tester 14, an inverter drive 16 including a microprocessor (not shown in FIG. 2), a controlled area network ("CAN") 18, and a test circuit 20. The tester 14, located at the end of the manufacturing line, is coupled to the microprocessor of the inverter drive 16 via the CAN 18 for passing commands and data between the tester 14 and the microprocessor. The test circuit 20 includes five relays, individually referenced as $Ra_1$, $Ra_2$, $Ra_3$, $Ra_4$ and $Ra_5$, a current sensor 22 and a current limiter 24. The tester 14 controls the relays $Ra_1$, $Ra_2$, $Ra_3$, $Ra_4$ and $Ra_5$, in the test circuit 20, monitors the voltage of each of the IGBTs A+, A−, B+, B−, C+, C−, and makes decisions based upon production tests. The inverter drive 16 provides drive signals to the gates of the IGBTs A+, A−, B+, B−, C+, C−, which are synchronized with the states of the relays $Ra_1$, $Ra_2$, $Ra_3$, $Ra_4$ and $Ra_5$ by the tester 14 to selectively turn each individual IGBT ON and OFF, one at a time, thereby controlling the current going through the IGBTs during testing. Two current sensing signals $I_a$ and $I_b$ provide the phase current to the microprocessor of the inverter drive 16. The collector-emitter voltage $V_{ce}$ across the collector c and emitter e of each of the IGBTs, is measured during the testing of the IGBTs and provided to the tester 14.

Testing of the IGBT switching circuits, for example, A+, requires control relays $Ra_1$ and $Ra_5$ to be closed. After the microprocessor of the inverter drive 16 commands IGBT A+ ON, current will travel through its collector and emitter terminals, c and e respectively, relay $Ra_1$, current limiter 24 and relay $Ra_5$. If IGBT A+ is not faulty, the collector-emitter voltage $V_{ce}$ across the IGBT A+ will be close to zero volts and the current feedback $I_a$ will be equal to a predetermined value. The microprocessor of the inverter drive 16 reads the phase current $I_a$ and sends that value to the tester 14 via the CAN 18.

Further reference to FIG. 2 shows the absence of a current feedback sensor for the C phase, and hence, no current information available for the C phase. This is due to hardware limitations and cost. Accordingly, the two C phase IGBTs C+, C− can only be tested with a measurement of the respective collector-emitter voltages $V_{ce}$. In order to test all six IGBTs A+, A−, B+, B−, C+, C−, at least six measurements are required. Among the six measurements, four require both current and voltage measurements, while two require only voltage measurements.

As illustrated above, the IGBTs have rather complicated gate drive circuits and can be easily damaged resulting in undiscovered errors. This makes the manufacture of IGBT based power circuits and drive circuits difficult and complex. Further, in the case of a faulted IGBT 1 in the field, diagnostics that pinpoint the exact faulted transistor are also difficult and challenging. Accordingly, there is a need for an improved method of detecting faulted IGBTs.

BRIEF SUMMARY OF THE INVENTION

By providing an improved testing method, both manufacturing test procedures and equipment may be simplified, and production time and cost may be reduced. Additionally, such a detection method may provide a diagnostic routine and equipment capable of locating a faulted IGBT in the field.

In the disclosed embodiments, the present invention may alleviate the drawbacks described above with respect to diagnosing faulted IGBT circuits. The present invention provides a method and apparatus for measuring the current across various IGBT circuits by connecting the output of an inverter to a three-phase resistor load having a common resistance value.

It should be understood that the present invention is not limited to uses related to EVs, or even AC induction drives, but is applicable to any inverter applications, including distributed power, such as fuel cells, micro-turbines and windmills, static/dynamic power quality converters, and so forth.

The beneficial effects described above apply generally to each of the exemplary descriptions and characterizations of the devices and mechanisms disclosed herein. The specific structures through which these benefits are delivered will be described in detail herein below.

In one aspect, a method for measuring fault diagnostics for an IGBT power converter circuit includes selectively turning ON a first, a second and a third IGBT, wherein each of the first, the second and the third IGBT may be either upper (A+, B+ or C+) or lower (A−, B− or C−) ones of IGBT pairs (i.e., first IGBT pair A+ and A−, second IGBT pair B+ and B−, and third IGBT pair C+ and C−). These upper and lower IGBTs are illustrated in FIG. 3. One skilled in the art will readily recognize that the use of the terms "upper" and "lower" are for convenience in referring the relative electrical positions of the IGBTs in the electrically coupled pairs, and these terms do not imply any specific spatial orientation within a power converter, vehicle, other device, or with respect to any other spatial reference frame.

The method also includes measuring a current feedback of the first and the second IGBT and comparing the current feedback of the first and the second IGBT to a current value of the third IGBT, wherein the current value is determined by a resistor value. The method further includes determining a fault-state for the IGBTs and concluding that the IGBTs are either normal, open or shorted based upon the results of the comparison. When all the IGBTs are normal, no voltage measurements are required. The output of an inverter is connected to a multi-phase resistor load and when one faulty IGBT exists, a gate drive fault is generated at the faulty IGBT where the fault is an open fault. Where the fault in an IGBT is a short, a diagnostics circuit shuts down to protect the remainder of the IGBTs.

In another aspect, an apparatus for measuring fault diagnostics for an IGBT power converter circuit includes a plurality of IGBTs which may be selectively turned ON, wherein the plurality of IGBTs may be grouped in pairs and identified as either upper IGBTs (A+, B+ or C+) or lower IGBTs (A−, B− or C−) of each pair. The apparatus also includes a resistor load coupled to the plurality of IGBTs, a current sensor coupled to two of the three phase outputs and an inverter drive, wherein the inverter drive is operable for receiving current feedback from the plurality of IGBTs. The apparatus further includes a tester in communication with the inverter drive and a voltage source coupled to the plurality of IGBTs.

In another aspect, a fault determination method for assessing a condition of a power converter circuit, the power converter circuit having a number N of pairs of insulated gate bipolar transistors ("IGBTs"), each pair of IGBTs having an upper IGBT coupled to a first polarity of a DC power source and a lower IGBT coupled to a second polarity of the DC power source, includes but is not limited to: selectively placing in a conducting state at least one upper IGBT during a first time and selectively placing in a conducting state at least one lower IGBT during the first time; and determining a set of IGBT operational states in response to at least one of a magnitude and a direction of a current through a load between the at least one upper and the at least one lower IGBT during the first time.

In another aspect, a fault determination method for assessing a condition of a power converter circuit, the power converter circuit having a number N of pairs of (IGBTs), each pair of IGBTs having an upper IGBT coupled to a first polarity of a DC power source and a lower IGBT coupled to a second polarity of the DC power source, includes but is not limited to: during a first time interval, controlling at least one upper IGBT and at least one lower IGBT such that at least one first-time-interval expected current will flow through a part of a resistive network if the at least one upper IGBT and the at least one lower IGBT are normal, sensing at least one of a magnitude and a direction of at least one first-time-interval current through the part of the resistive network, comparing the at least one first-time-interval sensed current with the at least one first-time-interval expected current; and concluding a state of at least one IGBT in response to the comparing.

In another aspect, a fault determination method for assessing a condition of a power converter circuit, the power converter circuit having a number N of pairs of (IGBTs), each pair of IGBTs having an upper IGBT coupled to a first polarity of a DC power source and a lower IGBT coupled to a second polarity of the DC power source, includes but is not limited to: during a first time interval and in response to a motor indicating a fault, sequentially controlling at least one upper IGBT and at least one lower IGBT such that at least one first-time-interval expected current will flow through a part of motor windings if the at least one upper IGBT and the at least one lower IGBT are normal, sensing at least one of a magnitude and a direction of at least one first-time-interval current through the part of the motor windings; comparing the at least one first-time-interval sensed current with the at least one first-time-interval expected current and concluding a state of at least one IGBT in response to the comparing.

In one or more various embodiments, related systems include but are not limited to circuitry and/or programming for effecting the foregoing-referenced method embodiments; the circuitry and/or programming can be virtually any combination of hardware, software, and/or firmware configured to effect the foregoing-referenced method embodiments depending upon the design choices of the system designer.

The foregoing is a summary and thus contains, by necessity, simplifications, generalizations and omissions of detail; consequently, those skilled in the art will appreciate that the summary is illustrative only and is NOT intended to be in any way limiting. Other aspects, inventive features, and advantages of the devices and/or processes described herein, as defined by the claims, will become apparent in the detailed description set forth herein.

BRIEF DESCRIPTION OF THE SEVERAL VIEWS OF THE DRAWING(S)

DETAILED DESCRIPTION OF THE INVENTION

As required, detailed embodiments of the present invention are disclosed herein. However, it is to be understood that the disclosed embodiments are merely exemplary of the present invention that may be embodied in various and alternative forms. The figures are not necessarily to scale, e.g., some features may be exaggerated or minimized to show the details of particular components. Therefore, specific structural and functional details disclosed herein are not to be interpreted as limiting, but merely as a basis for the claims and as a representative basis for teaching one skilled in the art to variously employ the present invention. Unless the context requires otherwise, throughout this specification and claims which follow, the word "comprise" and variations thereof, such as, "comprises" and "comprising" are to be construed in an open, inclusive sense, that is as "including, but limited to."

Figure 3:
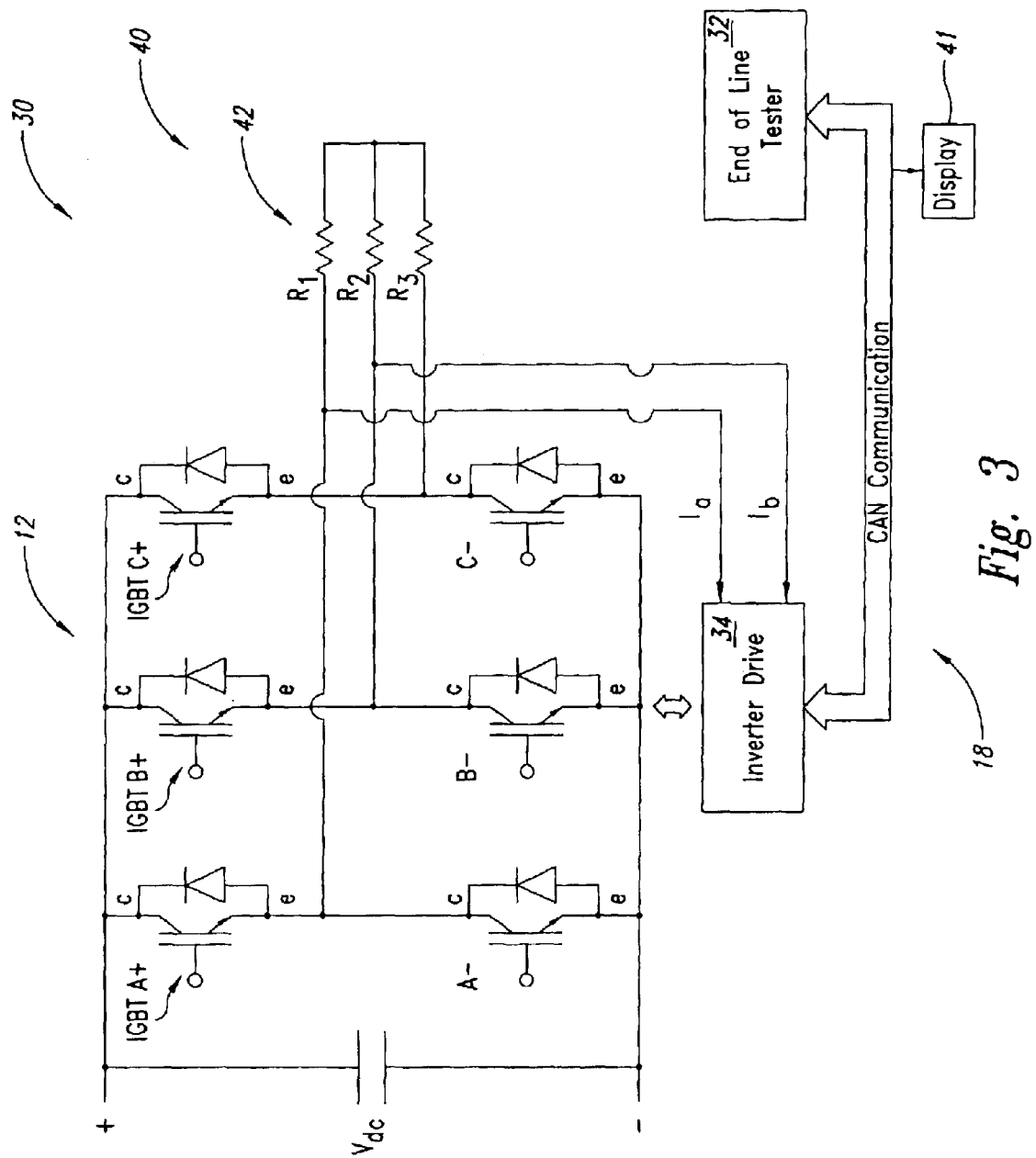
FIG. 3 is a circuit diagram of a test structure for testing IGBTs in a three-phase AC inverter according to one illustrated embodiment of the present invention.

FIG. 3 shows a test structure 30 including a voltage source $V_{dc}$, a tester 32, an inverter drive 34 having a microprocessor 36 (FIG. 4), a (CAN) 18, and a test circuit 40 for testing an inverter 12, according to one illustrated embodiment of the present invention. The inverter 12 may, or may not, be part of a power converter, for example for use in a vehicle or stationary power application. The test structure 30 may include an optional printer or display 41 for reviewing test results.

Figure 1:
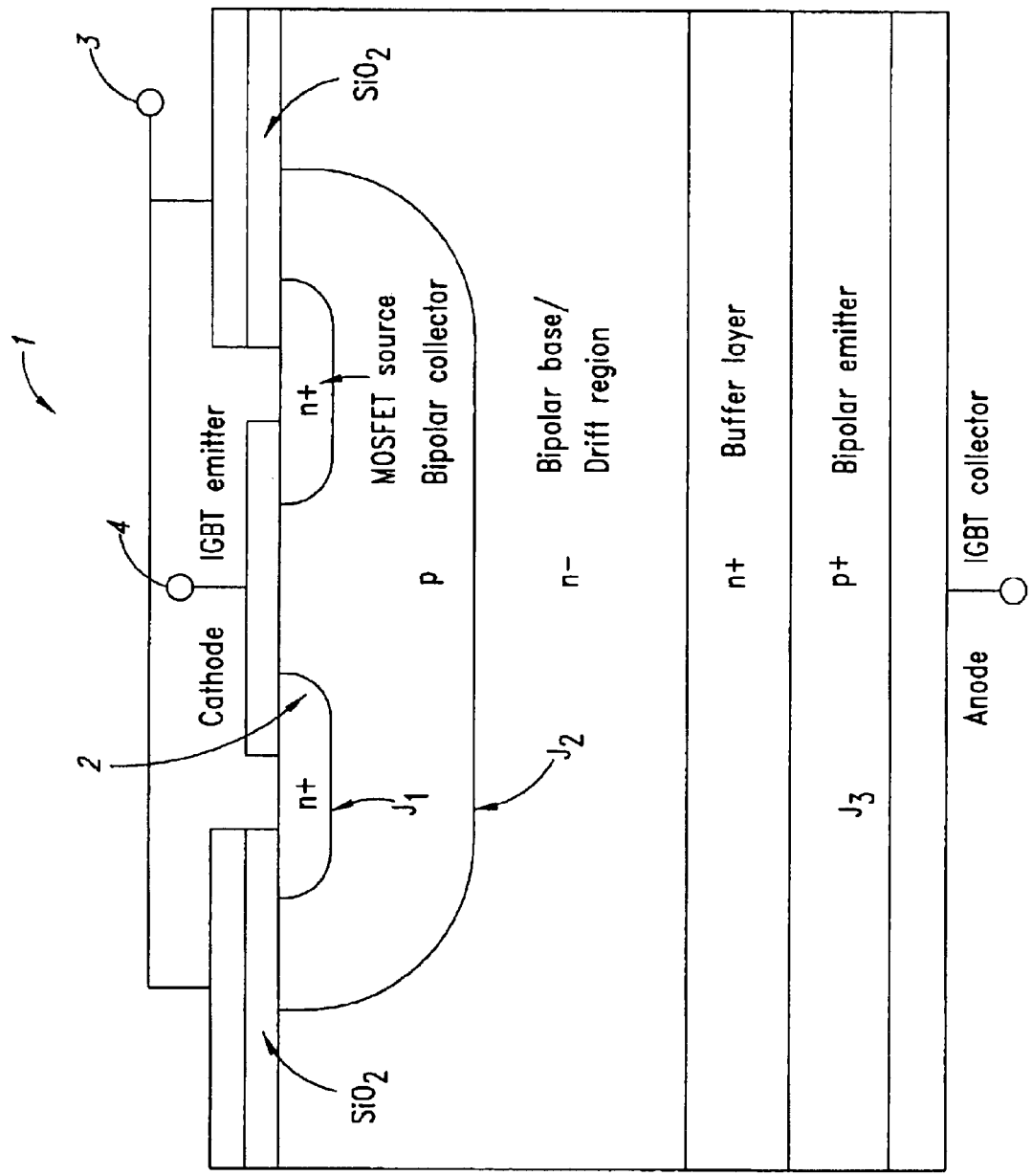
FIG. 1 is an illustration of the structure of a typical IGBT as known in the art.
Figure 2:
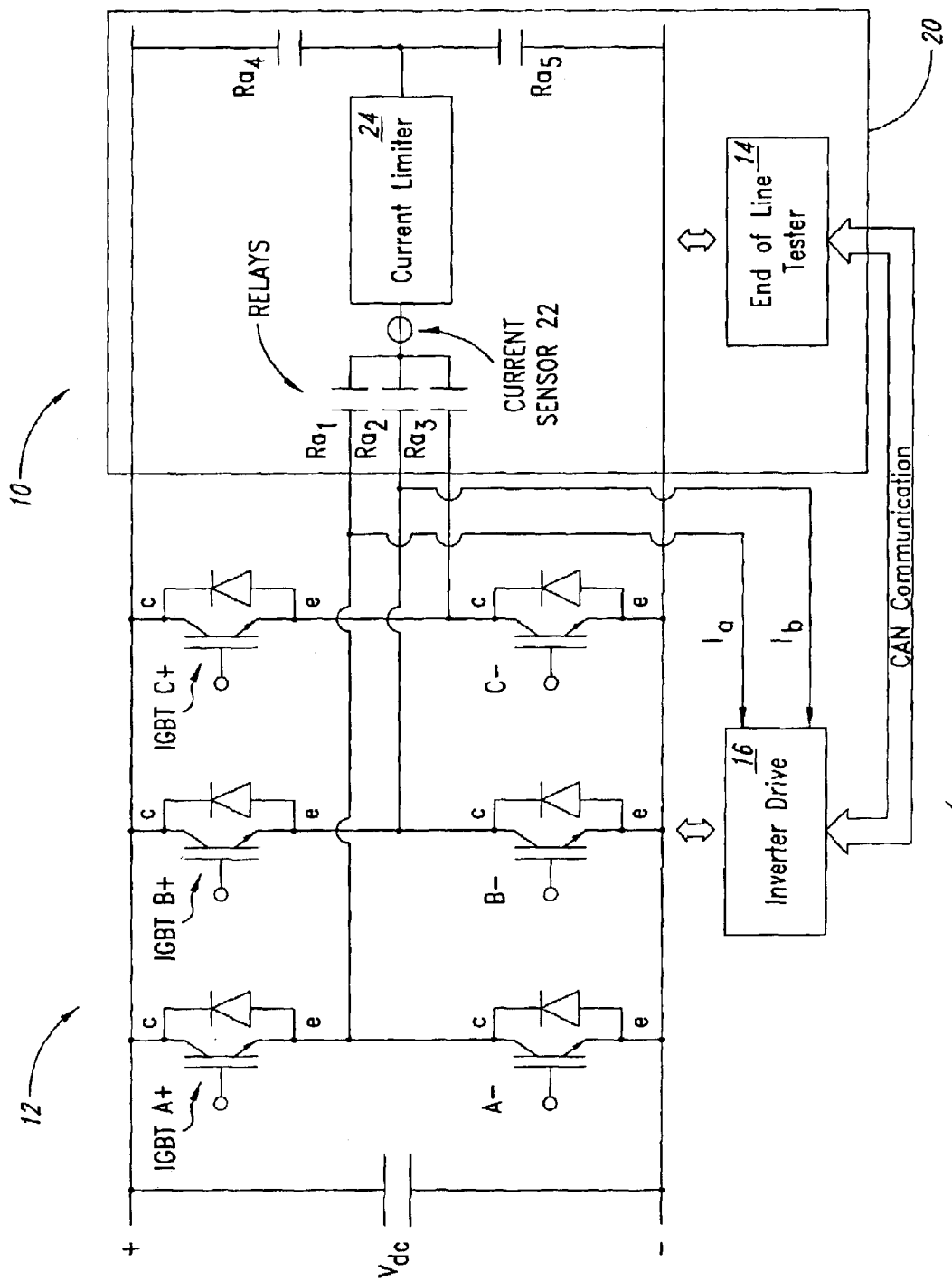
FIG. 2 is a circuit diagram of a test structure including a test circuit for testing IGBTs in a three-phase AC inverter.

In contrast to the test circuit 20 of FIG. 2, the output of the inverter 12 is connected to a three-phase resistor load 42, of the test circuit 40, formed by three resistors $R_1$, $R_2$, $R_3$ all having at least approximately the same value of resistance R. Two current feedbacks, $I_a$ and $I_b$, are returned to the microprocessor 36 (FIG. 4) of the inverter drive 34, while a set of gate drive circuitries on a gate drive board 44 (FIG. 4) monitor the voltages $V_{ce}$ across each IGBT A+, A−, B+, B−, C+, C−. This test structure 30 is simpler, and makes fuller use of the capabilities of the microprocessor 36 (FIG. 4) than the test structure 10 of FIG. 2, and in certain embodiments may eliminate the need for the tester 32.

Figure 4:
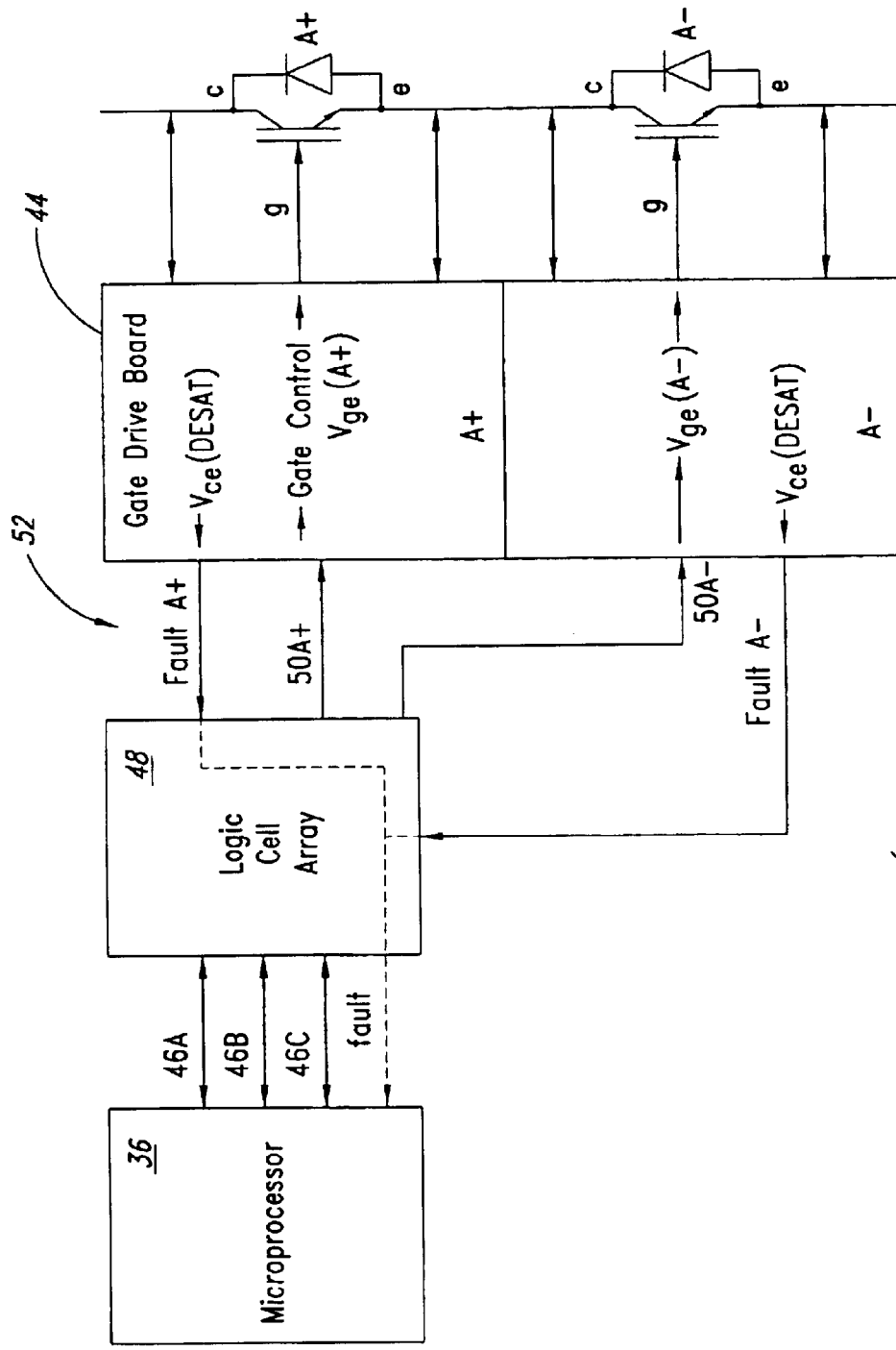
FIG. 4 is a functional block diagram of a portion of the test structure of FIG. 3, illustrating the testing of one phase of the three-phase AC inverter according to one illustrated embodiment of the invention.

FIG. 4 is a functional block diagram of a portion of the inverter drive 34, driving a single pair of the IGBTs A+, A− for testing a first phase A of the inverter 12. The microprocessor 36 handles all the input signals and manages and controls the outputs based on control algorithms. Among the outputs, the microprocessor 36 provides three Pulse Width Modulation (PWM) output signals 46A, 46B, 46C to a Logic Cell Array (LCA) 48. The LCA 48 may take the form of an appropriately programmed Field Programmable Gate Array ("FPGA"). The LCA 48 is a programmable digital circuit that generates six IGBT gate control signals 50A+, 50A− (only two shown) based on the three PWM output signals 46A, 46B, 46C from the microprocessor 36. The LCA 48 also handles all of the fault signals collectively referenced as 52 coming from the circuitries on the gate drive board 44. It should be noted that FIG. 4 only shows one of the three phases of the gate drive circuitry. It should also be noted that the phases are referred to as first, second and third phases for convenience only and such reference should not be interpreted as an enumeration or ordering the operation of the corresponding IGBTs A+, A−, B+, B−, C+, C−.

For every IGBT A+, A−, B+, B−, C+, C− there is an isolated control signal $V_{ge}$ for the gate control, and the forward voltage (or conducting or collector-emitter voltage) $V_{ce}$ is measured to detect a De-Saturation (DESAT) fault. When an IGBT is forward conducting, if there is a large current passing through the IGBT, the collector-emitter voltage $V_{ce}$ will increase as the conducting current increases. As soon as the collector-emitter voltage $V_{ce}$ reaches a certain voltage level (corresponding to a certain current level), the corresponding drive circuit on the gate drive board 44 will generate a fault 52, called a DESAT fault, and shut down the gate control signals $V_{ge}$.

The following are examples of six different situations, each illustrating the acts taken to test and diagnose all six IGBTs A+, A−, B+, B−, C+, C−.

All IGBTs Normal (i.e., Not Faulty)

Only two test measurements are needed to determine if all IGBTs A+, A−, B+, B−, C+, C− are normal. For example, the microprocessor 36 commands IGBTs C−, A+ and B+ ON at a same time. If all six IGBTs A+, A−, B+, B−, C+, C− are in a normal, non-faulty condition, the current $I_a$ flowing through the first phase upper IGBT A+ and the current $I_b$ flowing through the second phase upper IGBT B+ should be equal to the same predetermined value, I, the normal current flowing through when no fault exists, which is half of the value of the current flowing through, the third phase lower IGBT C−. Current value is determined by the resistance R. Likewise, commanding the third phase upper IGBT C+, the first phase lower IGBT A− and the second phase lower IGBT B− ON at a same time, current feedback $I_a$ and $I_b$ will have the same predetermined value I, but with opposite current

TABLE 1

| Command ON | Current Feedback | Fault | Conclusion |
|---|---|---|---|
| A+, B+, C− | $I_a = I_b = I$ | None | A+, B+ and C− are OK |
| A−, B−, C+ | $I_a = I_b = -I$ | None | A−, B− and C+ are OK |

In the above measurements, even though no current feedback information is available for the C phase, the IGBTs C+, C− in the C phase can be viewed as normal if the correct current feedback values are observed in phase A and B. Furthermore, since the circuits of the gate drive board 44 monitor the voltage $V_{ce}$ between the collector c and the emitter e of the IGBT that is being turned ON, no voltage measurements by the tester 32 are required. Advantageously, measurement and testing time may be greatly reduced.

One Faulty IGBT in any Single Phase

At least three steps are required to determine the faulty IGBT in this scenario. Consider for example, the case of the first phase upper IGBT A+ being open or the first phase lower IGBT A− being shorted. When the upper IGBTs A+, B+ and C− are commanded ON, if the first phase upper IGBT A+ is faulty, i.e., A+ is open, the collector-emitter voltage $V_{ce}$ across the first phase upper IGBT A+ will be high, generating a gate drive fault 50A+ sent to the microprocessor 36. However, if the first phase lower IGBT A− is the faulty transistor, i.e., the phase lower IGBT A− is shorted but first phase upper IGBT A+ is normal, then when first phase upper IGBT A+ is commanded ON a large current will pass through the first phase pair of IGBTs A+, A− due to the shorted first phase lower IGBT A−. The DESAT circuit will shut down the inverter 12 to protect the IGBTs and generate a fault at 50A+. Accordingly, the same fault signal will be generated for two different faults at two different places.

In order to be able to determine whether first phase upper IGBT A+ is open or first phase lower IGBT A− is shorted, and thereby determine where the fault occurred, only the third phase upper IGBT C+ needs to be turned ON. If the current feedback $I_a$ is equal to approximately −1.5 times the predetermined current I, then the first phase lower IGBT A− is shorted. If no current feedback is observed (i.e., $I_a$ is equal to $I_b$ is equal to zero), then the first phase upper IGBT A+ is open, and the first phase lower IGBT A− is not faulty.

To check and to determine if the second phase upper IGBT B+, the second phase lower IGBT B−, the third phase upper IGBT C+ and the third phase lower IGBT C− are normal with respect to predetermined current feed back $I_a$ and $I_b$, the second phase upper IGBT B+ and third phase lower IGBT C− should be turned ON, followed by the turning ON of the second phase lower IGBT B− and third phase upper IGBT C+. In the case of the second phase upper IGBT B+ and third phase lower IGBT C− being turned ON, the current feedback $I_b$ should be the negative of 1.5 times the predetermined current I.

In a like manner, a single opened or shorted IGBT in phase B or C can be identified. Table 2 summarizes detection of one fault as described above.

TABLE 2

| Command ON | Current Feedback | Fault | Conclusion |
|---|---|---|---|
| A+, B+, C− | None | A+ | Either A+ open or A− shorted |
| A−, B−, C+ | $I_a = I_b = -I$ | None | A−, B− and C+ OK; or A− shorted |
| C+ | $I_a = -1.5I$ or $I_a = I_b = 0$ | None | A− is shorted and A+ may be OK; A+ is open and A− is OK |
| B+, C− | $I_b = -1.5I$ | None | B+ and C− OK |
| B−, C+ | $I_b = 1.5I$ | None | B− and C+ OK |

One or Two Faulty IGBTs in Phase C

Consider the example of the fault(s) of C+ open and/or C− shorted. To perform the test, the first phase upper IGBT A+, second phase upper IGBT B+ and third phase lower IGBT C− are commanded ON by the microprocessor 36. Similar to the previous example, if the third phase upper IGBT C+ is open, its current-emitter voltage $V_{ce}$ will be high, causing a corresponding gate drive fault signal (i.e., fault C+) to be sent out by the microprocessor 36. However, if the third phase lower IGBT C− is shorted and the third phase upper IGBT C+ may or ma not be open, then when the first phase lower IGBT A−, the second phase lower IGBT B− and the third phase upper IGBT C+ are commanded ON in the next step of testing, a large current through the IGBTs due to the shorted C−. The DESAT circuit shuts down protecting inverter 12 and generates a fault 52 (i.e., fault C+). Again the same fault generated for two different faults at two different places.

The next step in the testing is to determine whether just one IGBT in a single phase is faulty, or both IGBTs in that phase are faulty. Here the microprocessor 36 commands ON both the first phase upper and the second phase lower IGBTs, A+, B−, respectively. If the results of the current feedback are $I_a$ is equal to 1.5 times the predetermined current I and $I_b$ is equal to −1.5 times the predetermined current I, then it may be concluded that the third phase upper IGBT C+ is open. If the results of the current feedback for both $I_a$ and $I_b$ is negative I, then it may be concluded that the third phase lower IGBT C− is shorted, and that the first phase upper and second phase lower IGBTs A+, B−, respectively, are normal. Further testing is still required to determine whether the first phase upper IGBT B− and the second phase upper IGBT A− are normal.

Determination of whether all the IGBTs have been checked can be made by commanding the first phase lower IGBT A− and the second phase upper IGBT B+ ON. If the results of the current feedback are $I_a$ is equal to −1.5 times the predetermined current I and $I_b$ is equal to 1.5 times the predetermined current I, then it may be concluded that the third phase upper IGBT C+ is open, and that the first phase lower IGBT A− and the second phase upper IGBT B+ are normal. If the results of the current feedback are $I_a$ is equal to −I and $I_b$ is equal to I, then it may be concluded that the third phase lower IGBT C− is shorted.

Table 3 summarizes detection of one or two faults in one phase as described above.

TABLE 3

| Command ON | Current Feedback | Fault | Conclusion |
|---|---|---|---|
| A−, B−, C+ | None | C+ | Either C+ open and/or C− shorted |
| A+, B+, C− | $I_a = I_b = -I$ | None | A− and B− OK; C− may be shorted |
| A+, B− | $I_a = -I_b = -1.5I$ or $I_a = -I_b = -I$ | None | C+ open; A+ and B− may be OK; C− shorted; A+ and B− may be OK |
| A−, B+ | $I_b = -I_a = I$ or $I_b = -I_a = 1.5I$ | None | C− shorted; A− and B+ OK; C+ open; A− and B+ OK |

One or Two Faulty Transistors in any Two Phases

Consider the example of the first phase upper IGBT A+ open and/or the first phase lower IGBT A− shorted, and the second phase upper IGBT B+ open and/or the second phase lower IGBT B− shorted. The same logic as shown previously applies, the microprocessor 36 commanding the first phase upper, second phase upper and third phase lower IGBTs A+, B+ and C−, respectively, ON. In this situation where there is one or two faulty IGBTs in any two phases, no current feedback will be detected, and a fault will be indicated in both the A and B phases. Accordingly, all that is known at this point of the testing is that first phase upper IGBT A+ is open and/or the first phase lower IGBT A− is shorted, and the second phase upper IGBT B+ is open and/or the second phase lower IGBT B− is shorted.

As before, the microprocessor 36 next commands ON the first phase lower, the second phase lower, and the third phase upper IGBTs A−, B− and C+, respectively. If the current feedback shows both $I_a$ and $I_b$ to be the opposite of the predetermined current I, then it may be concluded that either the first phase lower IGBT A−, the second phase lower IGBT B− and the third phase upper IGBT C+ are normal, or that the first phase lower IGBT A− and the second phase lower IGBT B− are both shorted. It is still unknown at this point whether the first and second phase upper IGBTs A+, B+, respectively, are open.

The next step indicates where the faults occurred in the A and B phases. To do so, the microprocessor 36 turns ON only the third phase upper IGBT C+. If the current feedback for both $I_a$ and $I_b$ is the opposite of the predetermined current I, then it is determined that at least the first and second phase lower IGBTs A−, B−, respectively, are faulty. The first and second phase upper IGBTs A+, B+, respectively, may or may not be faulty. If the current feedback for $I_a$ is both the opposite and 1.5 times the predetermined current I and no current feedback is given by $I_b$ then it is determined that at least first phase lower IGBT A− and the second phase upper IGBT B+ are faulty. The first phase upper IGBT A+ may or may not be faulty. If the current feedback for $I_b$ is both the opposite and 1.5 times the predetermined current I and no current feedback is given by $I_a$, then it is determined that at least the second phase lower IGBT B− and the first phase upper IGBT A+ are both faulty. The second phase upper IGBT B+ may or may not be faulty. If no current feedbacks are both zero, then it may be concluded that both the first and the second upper IGBTs A+, B+, respectively, are open.

Table 4 summarizes detection of one or two faults in two phases, but not in phase C, as described above.

TABLE 4

| Command ON | Current Feedback | Fault | Conclusion |
| --- | --- | --- | --- |
| A+, B+, C− | None | A+ and/or B+ | A+ open and/or A− shorted and/or B+ open and/or B− shorted |
| A−, B−, C+ | $I_a = -I$ and/or $I_b = -I$ | None | A−, B−, C+ OK; or A− and/or B− shorted |
| C+ | $I_a = -I$ and $I_b = -I$ or $I_a = -1.5I$ and $I_b = 0$ or $I_b = -1.5I$ and $I_a = 0$ or $I_a = I_b = 0$ | None | A− shorted; A+ may be open or OK and B− shorted; B+ may be open or OK A− shorted; A+ may be open or OK and B+ open B− shorted; B+ may be open or OK and A+ open A+ and B+ are open |

It should be noted that every IGBT has been tested through the current feedback signal except C−. However, since no fault signal is generated in the first test, it is understood that the correct voltage level has occurred at C−.

Table 5 illustrates the test procedure for the case of faulty transistors in two phases where one of the faults occurs in the C phase. Table 5 illustrates the steps followed and the possible results for the situation of third phase upper IGBT C+ open and/or third phase lower IGBT C− shorted, and first phase upper IGBT A+ open and/or first phase lower IGBT A− shorted.

TABLE 5

| Command ON | Current Feedback | Fault | Conclusion |
| --- | --- | --- | --- |
| A+, B+, C− | None | A+ | A+ open and/or A− shorted; and B+ and C− OK; or B+ open and/or C− shorted |
| A−, B−, C+ | None | C+ | C+ open and/or C− shorted; and A− and B− OK; or A− and/or B− shorted |
| B+ | $I_a = -I$ and $I_b = 2I$ or $I_a = -1.5I = -I_b$ or $I_b = -1.5I$, $I_a = 0$ or $I_b = I_a = 0$ | None | A−, C− shorted; B+ OK A− shorted; C+ open C− shorted; A+ open C+ and A+ are open |

It should be noted that every IGBT has been tested through the current feedback signal except the second phase lower IGBT B−. However, since no fault signal is generated in the first test, it is understood that the correct voltage level has occurred at the second phase lower IGBT B−. Furthermore, the test cases with faulty IGBTs in phase B and C are similar to the above case.

A Faulty IGBTs in all Three Phases

Consider the situation of the first phase upper IGBT A+ open and/or the first phase lower IGBT A− shorted, the second phase upper IGBT B+ open and/or the second phase lower IGBT B− shorted, and the third phase upper IGBT C+ open and/or the third phase lower IGBT C− shorted. When the first phase upper IGBT A+, the second phase upper IGBT B+ and third phase lower IGBT C− are commanded ON, followed by commanding ON the first phase lower IGBT A−, the second phase lower IGBT B− and the third phase upper IGBT C+, faults will occur in every phase (A, B and C). In this situation, there is no need to continue testing as all power modules will be seen as faulty devices.

As seen from the above six situations, if there is no faulty IGBT in the inverter 12, as is the instance in the majority of cases, only two tests are required to diagnose the same. Should any IGBT failure exist, up to five tests are required in order to locate the failed IGBT(s). Other than a three-phase resistor load, no extra hardware circuitry is required. Additionally, this method and apparatus for testing makes full use of the intelligent microprocessor 36 and extra information from the circuits of the gate drive board 44.

IGBT Fault Detection With an AC Motor Connected

Figure 5:
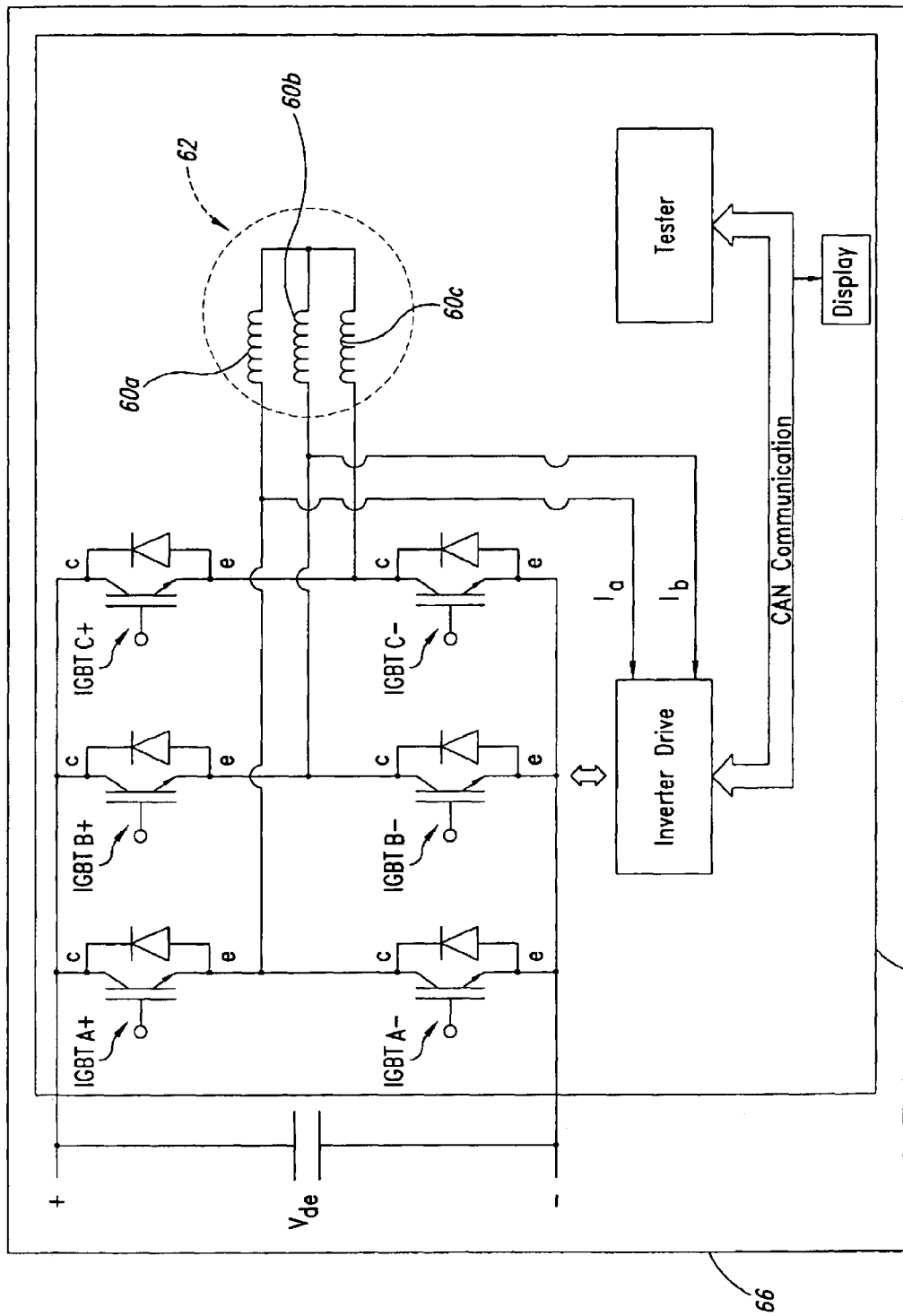
FIG. 5 is a circuit diagram of a test structure for in field testing of IGBTs in a three-phase AC inverter, such as for testing in a three-phase AC inverter mounted in a power conversion module of a vehicle, according to another illustrated embodiment of the present invention.
Figure 6:
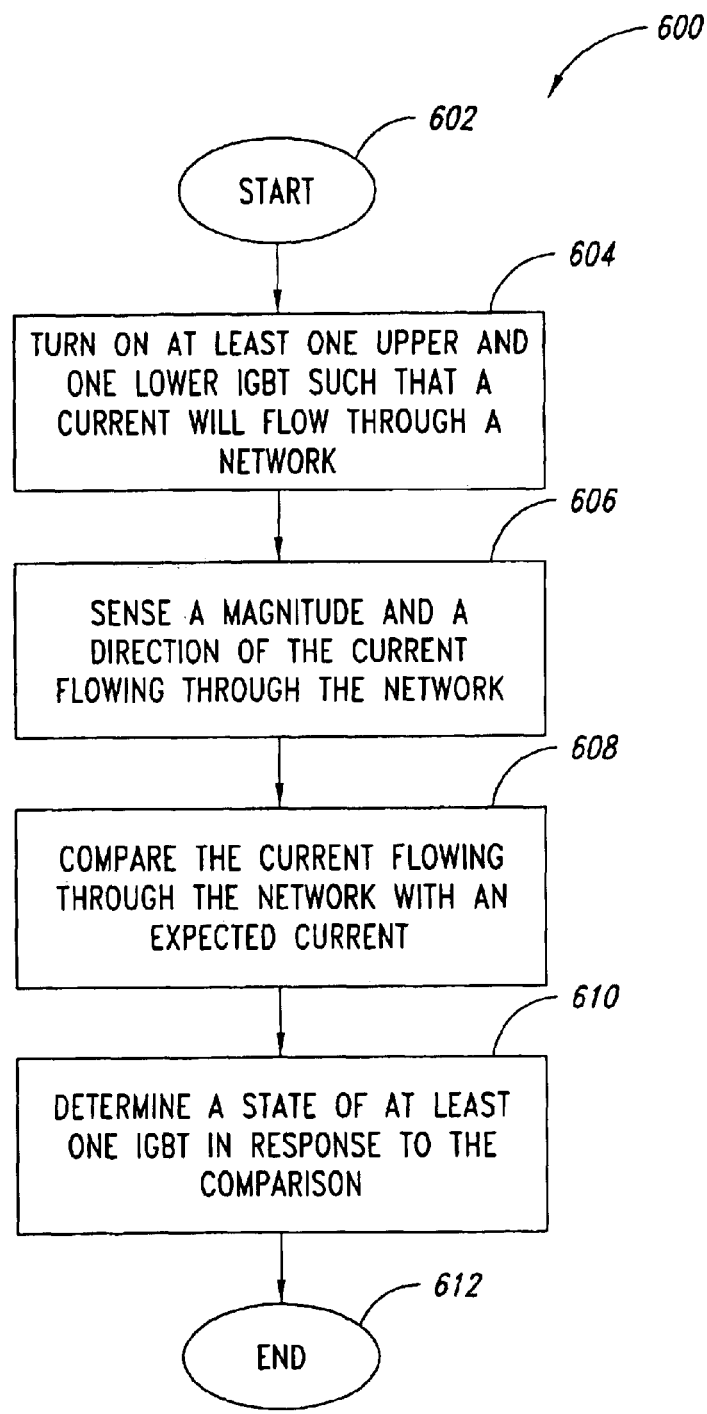
FIG. 6 is a flow chart showing the process of determining a state of an IGBT in response to a comparison of measured and expected currents.

In the field, after a failure occurs on the inverter 12, the microprocessor 36 generates a gate drive fault indicating that one of the IGBTs failed without the above described logic. However, due to the complexity of the gate drive circuit and the inaccessibility of each individual IGBT, the above described system and method is very difficult to determine which, if any, IGBT failed without the above described logic. With very minor changes to the above, the above described system and method may be used as an AC inverter field diagnostic tool. Referring to FIG. 5, instead of utilizing the three-phase resistor load described above with reference to FIG. 3, the stator windings 60a, 60b, 60c of a three-phase motor 62 are used as the load. Such a diagnostics method and tool avoids the difficulty and problem of removing parts only to find that no IGBT has failed. The inverter 12 and test circuitry 30 may be part of a power module 64 for installation in a vehicle 66.

AC motors 62 have very low impedance at stand still. Thus, in order to avoid huge current passing through the motor's windings, the IGBTs' ON time should be very short, i.e., pulsed. In other words, the IGBTs' ON time should be less than the switching period of the inverter 12. Also, the turn ON signals for upper and lower IGBTs A+, B+, C+ and A−, B−, C−, respectively, of each phase should not overlap each other. The output may be configured as either an output compare or a (PWM) function so that the duty cycle is less than the switching period.

For example, when an ON signal for the first phase upper IGBT A+ is generated, normally it is a PWM signal. When testing occurs in a manufacturing facility, as illustrated in FIG. 3, a resistor is generally available for limiting the current, with the current level determined by the resistance R and the DC bus voltage level. Typically, in a manufacturing facility environment, a power supply will be available for adjusting the DC voltage level. Accordingly, through the use of the resistor $R_1$, $R_2$, $R_3$ the current can be turned ON and kept ON without the concern of current overload.

However, in the case of an AC motor 62 in the field, for example in a vehicle 66, the current cannot always be ON because it would be too high, overloading the IGBTs. Since there is no power supply available that can adjust the DC bus voltage level, a PWM signal is used that limits the ON time, or duty cycle, to a very short time. By adjusting the duty cycle, the current can be measured within a reasonable range.

The $V_{ge}$ shown in FIG. 4 is the gate control signal for controlling the IGBT and provided via the gate driving circuitry of the gate drive board 44. The control voltage $V_{ce}$ signal is also connected with the gate drive board. This $V_{ce}$ signal, or DESAT signal, is measured. When there is a large current passing through, the voltage $V_{ce}$ will increase causing a fault signal to be generated, shutting down the IGBT.

Due to hardware constraints, only one output signal is available for controlling both IGBTs in a single phase. The gate drive circuitry of the gate drive board 44 constructs the two control signals based upon the output control signal from the microprocessor 36. Therefore, if a short transistor ON time is required, both IGBTs of a phase will be turned ON within the one switching period. Typically, when an inverter 12 fails or generates a false fault signal (i.e., when there is no real fault), only one or, at most, two IGBTs have failed. Accordingly, the same principle as taught above can be used for detecting the failed IGBT(s). Following are three situations that further exemplify this.

Fault Signal Occurs at One Phase

Consider the example of a fault at the first phase upper IGBT A+. The motor 62 has indicated a fault in the A phase, but it is unknown whether the fault is with the first phase upper IGBT A+ transistor or with the first phase lower IGBT A−. Accordingly, the microprocessor 36 executes the following steps to determine where the fault occurred.

The second phase IGBTs B+, B− are first turned ON by the microprocessor 36, the upper IGBT B+ followed by the lower IGBT B−. No fault should be indicated in the B phase. The microprocessor 36 confirms that the duty cycle is small enough that no high current is flowing through the IGBTs. If the phase A current is equal to the input current $I_m$ and the negative of the phase B current, then it may be concluded that first phase lower IGBT A− has shorted. If the phase A current is equal to the phase B current and both are equal to zero, then it may be concluded that there is no short, i.e., first phase lower IGBT A− is not faulty, and either the first phase upper IGBT A+ is open or not faulty.

In order to determine whether first phase upper IGBT A+ is open or not faulty, the microprocessor 36 turns ON first phase upper IGBT A+ and second phase lower IGBT B−, followed by first phase lower IGBT A− and second phase upper IGBT B+. If the phase A current is equal to the input current $I_m$ and the negative of the phase B current, then no fault will be generated and it may be concluded that both first phase IGBTs A+, A− are not faulty. However, if the phase A current is equal to the phase B current and both are equal to zero, then a fault will be generated for the A phase, indicating that first phase upper IGBT A+ is open. Table 6 summarizes the above steps.

TABLE 6

| Command ON | Current Feedback | Fault | Conclusion |
| --- | --- | --- | --- |
| B+, then B− | $I_a = -I_b = I_m$ or $I_a = I_b = 0$ | None | A− shorted or A− OK; either A+ open or A+ OK |
| A+, B−; then A−, B+ | $I_a = -I_b = I_m$ or $I_a = I_b = 0$ | None A+ | A+ and A− are OK or A+ is open |

Fault Signal Occurs at Two Phases

Consider the example of a fault at both the first and third phase upper IGBTs A+, C+, respectively. In this example, the motor 62 has indicated a fault in both the A and C phases, but it is unknown where the fault has occurred in each phase. In order to determine which IGBT within each phase is faulty, the microprocessor 36 executes the following.

Initially the microprocessor 36 turns ON the B phase IGBTs B+, B−, the upper IGBT B+ followed by the lower IGBT B−, making certain that the duty cycle is small enough so that no high current is flowing through the IGBTs. With fault signals from both the A and C phases, one of three results should occur upon turning ON the B phase. If the phase A current is equal to the input current $I_m$ and the negative of the phase B current, then no fault will be shown indicating that no fault has occurred within the B phase. It may be concluded that first phase lower IGBT A− has shorted, and that the third phase lower IGBT C− may not be faulty.

If the phase B current is equal to twice the negative of the phase A current, then no fault has occurred within the B phase and it may be concluded that the first and third phase lower IGBTs A−, C−, respectively, have shorted. If the phase A current is equal to the phase B current and both are equal to zero, then no fault has occurred within the B phase and it may be concluded that either the first and the second upper IGBTs A+, C+, respectively, are open or are not faulty.

In the instance that no current feedback is provided, i.e., the phase A current is equal to the phase B current and both are equal to zero, the microprocessor 36 performs two further steps to determine whether the first and/or the second upper IGBTs A+, C+, respectively, are open or whether a false fault signal occurred. The microprocessor 36 first turns ON the first phase upper IGBT A+ and the second phase lower IGBT B−, followed by the first phase lower IGBT and the second phase upper IGBT in order to determine whether the first phase upper IGBT A+ is open or not. If the phase A current is equal to the feedback current $I_m$ and is the same as the negative of the phase B current, and no fault has occurred within the A phase, then it may be concluded that the first phase IGBTs A+, A− are not faulty. If the phase A current is equal to the phase B current and both are equal to zero, then a fault has occurred within the A phase and it may be concluded that first phase upper IGBT A+ is open.

In order to determine whether the third phase upper IGBT C+ is open or not, the microprocessor 36 turns ON the third phase upper IGBT C+ and the second phase lower IGBT B−, followed by the third phase lower IGBT C− and the second phase upper IGBT B+. If the phase B current is equal to the input current $I_m$, then no fault has occurred within the C phase and it may be concluded that third phase IGBTs C+ and C are not faulty. If the phase A current is equal to the phase B current and both are equal to zero, then a fault has occurred within the C phase and it may be concluded that third phase upper IGBT C+ is open.

Table 7 summarizes the above, given the condition that the first and second phase upper IGBTs A+, C+, respectively, are identified as faulted in the first test.

TABLE 7

| Command ON | Current Feedback | Fault | Conclusion |
|---|---|---|---|
| B+, then B− | $I_b = -I_a = I_m$ or | None | A− shorted; C− may be OK |
| | $I_b = -2I_a$ or | None | Both A− and C− are shorted |
| | $I_b = I_m, I_a = 0$ or | None | C− shorted, A+ open, A− |
| | $I_a = I_b = 0$ | None | may be OK A+ and C+ open; or A+ and C+ OK |
| A+, B−; then A−, B+ | $I_a = -I_b = I_m$ or $I_a = I_b = 0$ | None A+ | A+ and A− are OK A+ is open |
| C+, B−; then C−, B+ | $I_b = I_m$ or $I_a = I_b = 0$ | None C+ | C+ and C− are OK C+ is open |

Fault Signal Occurs at all Three Phases

In such a situation, no test is needed as all power modules will be seen as faulty devices.

While there has been disclosed effective and efficient embodiments of the invention using specific terms, it should be well understood that the invention is not limited to such embodiments as there might be changes made in the arrangement, disposition, and form of the parts without departing from the principle of the present invention as comprehended within the scope of the accompanying claims.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A fault determination method for assessing a condition of a power converter circuit, the power converter circuit comprising a number N of pairs of insulated gate bipolar transistors ("IGBTs"), each pair of IGBTs comprising an upper IGBT coupled to a first polarity of a DC power source and a lower IGBT coupled to a second polarity of the DC power source, the method comprising:

selectively placing in a conducting state at least one of the upper IGBTs during a first time and selectively placing in a conducting state at least one of the lower IGBTs during the first time; and determining a set of IGBT operational states in response to a magnitude and a direction of a current through a load between the at least one upper and the at least one lower IGBT placed in the conducting state during the first time.

2. The method of claim 1 wherein the N pairs of IGBTs comprises a first, a second, and a third upper IGBT respectively in series connection with a first, a second, and a third lower IGBT and further wherein the selectively placing in a conducting state at least one of the upper IGBTs during a first time and selectively placing in a conducting state at least one of the lower IGBTs during the first time further comprises:

turning on the first and the second upper IGBT during the first time and turning on the third lower IGBT during the first time.

3. The method of claim 1 wherein the N pairs of IGBTs comprises a first, a second, and a third upper IGBT respectively in series connection with a first, a second, and a third lower IGBT and further wherein the selectively placing in a conducting state at least one of the upper IGBTs during a first time and selectively placing in a conducting state at least one of the lower IGBTs during the first time further comprises:

turning on the first and the second lower IGBT during the first time and turning on the third upper IGBT during the first time.

4. The method of claim 1 wherein the selectively placing in a conducting state at least one of the upper IGBTs during a first time and selectively placing in a conducting state at least one of the lower IGBTs during the first time further comprises:

turning on an upper IGBT during the first time and turning on a lower IGBT during the first time.

5. The method of claim 1 wherein the determining a set of IGBT operational states in response to a magnitude and a direction of a current through a load between the at least one upper and the at least one lower IGBT placed in the conducting state during the first time further comprises:

concluding that the set includes at least one of the following
 (a) an operational state wherein all IGBTs in the power converter circuit are normal,
 (b) an operational state wherein at least one IGBT in one phase is faulty,
 (c) an operational state wherein at least one IGBT in two phases is faulty, and
 (d) an operational state wherein at least one IGBT in three phases is faulty.

6. The method of claim 1 further comprising:

selectively placing in a conducting state at least one of the lower IGBTs or at least one of the upper IGBTs during a second time; and selecting one operational state from the set of IGBT operational states in response to a magnitude and a direction of at least one current through the at least one of the lower IGBTs or the at least one of the upper IGBTs placed in the conducting state during the second time.

7. The method of claim 1 wherein the selection is further in response to at least one measured collector-emitter voltage indicative of a fault current.

8. A fault determination system for assessing a condition of a power converter circuit, the power converter circuit comprising a number N of pairs of insulated gate bipolar transistors ("IGBTs"), each pair of IGBTs comprising an upper IGBT coupled to a first polarity of a DC power source and a lower IGBT coupled to a second polarity of the DC power source, the system comprising:

means for selectively placing in a conducting state at least one of the upper IGBTs during a first time and selectively placing in a conducting state at least one of the lower IGBTs during the first time; and means for determining a set of IGBT operational states in response to a magnitude and a direction of a current through a load between the at least one upper and the at least one lower IGBT placed in the conducting state during the first time.

9. A fault determination method for assessing a condition of a power converter circuit, the power converter circuit comprising a number N of pairs of insulated gate bipolar transistors ("IGBTs"), each pair of IGBTs comprising an upper IGBT coupled to a first polarity of a DC power source and a lower IGBT coupled to a second polarity of the DC power source, the method comprising:

during a first time interval,
controlling at least one of the upper IGBTs and at least one of the lower IGBTs such that during at least one first-time-interval expected current will flow through a part of a resistive network if the at least one upper IGBT and the at least one lower IGBT are normal,
sensing a magnitude and a direction of at least one first-time-interval current through the part of the resistive network,
comparing the at least one first-time-interval sensed current with the at least one first-time-interval expected current, and
determining a state of at least one IGBT in response to the comparison.

10. The method of claim 9, wherein the N pairs of IGBTs comprises a first, a second, and a third upper IGBT respectively in series connection with a first, a second, and a third lower IGBT and wherein the method further comprises:

during the first time interval,
turning ON the first upper IGBT, the second upper IGBT, and the third lower IGBT such that if the first upper, the second upper and the third lower IGBT are normal,
a first expected current will flow through a first resistor in series with the first upper IGBT and a node,
a second expected current will flow through a second resistor in series with the second upper IGBT and the node, and
a third current will flow through a third resistor in series with the node and the third lower IGBT,
sensing a magnitude and a direction of a current in at least one of the first and the second resistors,
comparing the magnitude and the direction of the current in at least one of the first and the second resistors with a predetermined current value, and
concluding that the first upper IGBT, the second upper IGBT, and the third lower IGBT are normal in response to the comparison showing that the current in the first and the second resistors is balanced and within tolerance of the predetermined current value.

11. The method of claim 9, wherein the N pairs of IGBTs comprises a first, a second, and a third upper IGBT respectively in series connection with a first, a second, and a third lower IGBT and wherein the method further comprises:

during the first time interval,
turning ON the first lower IGBT, the second lower IGBT, and the third upper IGBT such that if the first lower IGBT, the second lower IGBT, and the third upper IGBT are normal,
a first expected current will flow through a first resistor in series with the first lower IGBT and a node,
a second expected current will flow through a second resistor in series with the second lower IGBT and the node, and
a third current will flow through a third resistor in series with the node and the third upper IGBT, and
sensing a magnitude and a direction of a current in at least one of the first and the second resistors,
comparing the magnitude and the direction of the current in at least one of the first and the second resistors with a predetermined current value, and
concluding that the first lower IGBT, the second lower IGBT, and the third upper IGBT are normal in response to the comparison determining that the current in the first and the second resistors is balanced and within tolerance of a negative of the predetermined current value.

12. The method of claim 9, wherein the N pairs of IGBTs comprises a first, a second, and a third upper IGBT respectively in series connection with a first, a second, and a third lower IGBT and wherein the method further comprises:

during the first time interval,
turning ON the first upper IGBT, the second upper IGBT, and the third lower IGBT such that if the first upper, the second upper, and the third lower IGBT are normal,
a first expected current will flow through a first resistor in series with the first upper IGBT and a node,
a second expected current will flow through a second resistor in series with the second upper IGBT and the node, and
a third current will flow through a third resistor in series with the node and the third lower IGBT,
sensing a magnitude and a direction of a current in at least one of the first and the second resistors, and
concluding that either the first upper IGBT is potentially open or the first lower IGBT is potentially shorted if the magnitude of the current in at least one of the first and the second resistors is substantially zero.

13. The method of claim 12, further comprising:
during a second time interval,
turning ON the first lower IGBT, the second lower IGBT, and the third upper IGBT such that if the first lower IGBT, the second lower IGBT, and the third upper IGBT are normal,
a first expected current will flow through the first resistor in series with the first lower IGBT and a node,
a second expected current will flow through the second resistor in series with the second lower IGBT and the node, and
a third current will flow through the third resistor in series with the node and the third upper IGBT,
sensing a magnitude and a direction of a current in at least one of the first and the second resistors,
comparing the magnitude and the direction of the current in at least one of the first and the second resistors with a predetermined current value, and
concluding either that the first lower IGBT, the second lower IGBT, and the third upper IGBT are normal or that the first lower IGBT is potentially shorted in response to the comparison determining that currents in the first and the second resistors are balanced and within tolerance of a negative of the predetermined current value.

14. The method of claim 13, further comprising:
during a third time interval,
turning ON the third upper IGBT such that current will flow through the first resistor if the first lower IGBT is shorted, and
sensing a magnitude and a direction of a current in the first resistor, and
concluding that the first upper IGBT is open and that the first lower IGBT is not faulty if the magnitude of the current in the first resistor is substantially zero and concluding that the first lower IGBT is shorted if the current in the first resistor is a negative of the predetermined current value.

15. The method of claim 14, further comprising:
during a fourth time interval,
turning ON the second upper IGBT and the third lower IGBT such that current will flow through the second and third resistors and bypass the first resistor if the second upper IGBT and the third lower IGBT are normal and no other IGBTs are shorted;
sensing a magnitude and a direction of a current in the second resistor,
comparing the magnitude and the direction of the current in the second resistor with the predetermined current value, and
concluding that the second upper IGBT and the third lower IGBT are normal in response to the comparison determining that the current in the second resistor is a negative of the predetermined current value.

16. The method of claim 15, further comprising:
during a fifth time interval,
turning ON the second lower IGBT and the third upper IGBT such that current will flow through the second and third resistors and bypass the first resistor if the second lower IGBT and the third upper IGBT are normal and no other IGBTs are shorted,
sensing a magnitude and a direction of a current in the second resistor,
comparing the magnitude and the direction of the current in the second resistor with the predetermined current value, and
concluding that the third upper IGBT and the second lower IGBT are normal in response to the comparison determining that the current in the second resistor is a positive of the predetermined current value.

17. The method of claim 9, wherein the N pairs of IGBTs comprises a first, a second, and a third upper IGBT respectively in series connection with a first, a second, and a third lower IGBT and wherein the method further comprises:
during the first time interval,
turning ON the first lower IGBT, the second lower IGBT, and the third upper IGBT such that if the first lower IGBT, the second lower IGBT, and the third upper IGBT are normal,
a first expected current will flow through a first resistor in series with the first lower IGBT and a node,
a second expected current will flow through a second resistor in series with the second lower IGBT and the node, and
a third current will flow through a third resistor in series with the node and the third upper IGBT,
sensing a magnitude and a direction of a current in at least one of the first and the second resistors,
determining if the magnitude of the current in at least one of the first and the second resistors is substantially zero, and
concluding that either the third upper IGBT is open or that the third lower IGBT is shorted in response to a determination that the magnitude of the current in at least one of the first and the second resistors is substantially zero and that a DESAT signal of at least one upper IGBT is active.

18. The method of claim 17, further comprising:
during a second time interval,
turning ON the first upper IGBT, the second upper IGBT, and the third lower IGBT such that if the first upper IGBT, the second upper IGBT, and the third lower IGBT are normal,
a first expected current will flow through the first resistor in series with the first upper IGBT and a node,
a second expected current will flow through the second resistor in series with the second upper IGBT and the node, and
a third current will flow through the third resistor in series with the node and the third lower IGBT,
sensing a magnitude and a direction of a current in at least one of the first and the second resistors,
comparing the magnitude and the direction of the current in the at least one of the first and the second resistors with the predetermined current value, and
concluding that the first lower IGBT and the second lower IGBT are normal, and that the third lower IGBT is potentially shorted in response to the comparison determining that currents in the first and the second resistors are balanced and within tolerance of a negative of the predetermined current value.

19. The method of claim 18, further comprising:
during a third time interval,
turning ON the first upper IGBT and the second lower IGBT such that current will flow through the first upper IGBT and the second lower IGBT and bypass the third resistor if the first upper IGBT and the second lower IGBT are normal and no other IGBTs are shorted,
sensing a magnitude and a direction of a current in at least one of the first and the second resistors,
comparing the magnitude and the direction of the current in the first and the second resistors with the predetermined current value, and
concluding that the third upper IGBT is open in response to the comparison determining that the magnitude and the direction of the current in the first resistor is a positive of the predetermined current value and concluding that the third lower IGBT is shorted in response to the comparison determining that the magnitude and the direction of the current in the first resistor is a negative of the predetermined current value.

20. The method of claim 19, further comprising:
during a fourth time interval,
turning ON the first lower IGBT and the second upper IGBT such that current will flow through the first lower IGBT and the second upper IGBT and bypass the third resistor if the first lower IGBT and the second upper IGBT are normal and no other IGBTs are shorted,
sensing a magnitude and a direction of a current in at least one of the first and the second resistors,
comparing the magnitude and the direction of the current in the first and the second resistors with the predetermined current value, and
concluding that the third lower IGBT is shorted, and that the first lower IGBT and the second upper IGBT are normal in response to the comparison determining that the magnitude and the direction of the current in the second resistor equals the predetermined current value and concluding that the third upper IGBT is open, and that the first lower IGBT and the second upper IGBT are normal in response to the comparison determining that the magnitude and the direction of the current in the second resistor is a positive of the predetermined current value.

21. The method of claim 9, wherein the power converter circuit comprises a first, a second, and a third upper IGBT respectively in series connection with a first, a second, and a third lower IGBT and wherein the method further comprises:
during the first time interval,
turning ON the first upper IGBT, the second upper IGBT, and the third lower IGBT such that if the first upper IGBT, the second upper IGBT, and the third lower IGBT are normal,
a first expected current will flow through a first resistor in series with the first upper IGBT and a node,
a second expected current will flow through a second resistor in series with the second upper IGBT and the node, and
a third current will flow through a third resistor in series with the node and the third lower IGBT,
sensing a magnitude and a direction of a current in at least one of the first and the second resistors, and
concluding the first upper IGBT is open or the first lower IGBT is potentially shorted or the second upper IGBT is open or the second upper IGBT is potentially shorted in response to a determination that the magnitude and the direction of the current in at least one of the first and the second resistors is substantially zero and that a DESAT signal of at least one upper IGBT is active.

22. The method of claim 21, further comprising;
during a second time interval,
turning ON the first lower IGBT, the second lower IGBT, and the third upper IGBT such that if the first lower IGBT, the second lower IGBT, and the third upper IGBT are normal,
a first expected current will flow through the first resistor in series with the first lower IGBT and a node,
a second expected current will flow through the second resistor in series with the second lower IGBT and the node, and
a third current will flow through the third resistor in series with the node and the third upper IGBT,
sensing a magnitude and a direction of a current in at least one of the first and the second resistors,
comparing the magnitude and the direction of the current in the first and the second resistors with a predetermined current value, and
concluding that at least one of the first and the second lower IGBTs are shorted in response to the comparison determining that the current in at least one of the first resistor and the second resistor are a negative of the predetermined current value.

23. The method of claim 22, further comprising:
during a third time interval,
turning ON the third upper IGBT such that no current will flow if no other IGBTs are shorted,
sensing a magnitude and a direction of a current in at least one of the first and the second resistors,
comparing the magnitude and the direction of the current in the first and the second resistors with a predetermined current value,
concluding that the first and the second lower IGBTs are shorted in response to the comparison determining that the current in the first resistor and the second resistor are balanced and equal a negative of the predetermined current value,
concluding that the first lower IGBT is shorted and the second lower IGBT is potentially open in response to the comparison determining that the current in the first resistor is a negative of the predetermined current value and the current in the second resistor is substantially zero,
concluding that the first lower IGBT is potentially open and the second lower IGBT is shorted in response to the comparison determining that the current in the second resistor is a negative of the predetermined current value and the current in the first resistor is substantially zero, and
concluding that the first lower IGBT is normal and the second lower IGBT is normal in response to the comparison determining that the magnitude of the currents in the first and the second resistors is substantially zero.

24. The method of claim 9, wherein the power converter circuit comprises a first, a second, and a third upper IGBT respectively in series connection with a first, a second, and a third lower IGBT and wherein the method further comprises:
during the first time interval,
turning ON the first upper IGBT, the second upper IGBT, and the third lower IGBT such that if the first upper IGBT, the second upper IGBT, and the third lower IGBT are normal,
a first expected current will flow through a first resistor in series with the first upper IGBT and a node,
a second expected current will flow through a second resistor in series with the second upper IGBT and the node, and
a third current will flow through a third resistor in series with the node and the third lower IGBT,
sensing a magnitude and a direction of a current in the first and the second resistors,
comparing the magnitude and the direction of the current in the first and the second resistors with a predetermined current value,
concluding that a potential short exists in the first lower IGBT or the third lower IGBT if the magnitude of the current in at least one of the first and the second resistors is substantially zero and a DESAT signal of at least one of the IGBTs is active.

25. The method of claim 24, further comprising;
during a second time interval,
turning ON the first lower IGBT, the second lower IGBT, and the third upper IGBT such that if the first lower IGBT, the second lower IGBT, and the third upper IGBT are normal,
a first expected current will flow through the first resistor in series with the first lower IGBT and a node,
a second expected current will flow through the second resistor in series with the second lower IGBT and the node, and
a third current will flow through the third resistor in series with the node and the third upper IGBT,
sensing a magnitude and a direction of a current in at least one of the first and the second resistors,
comparing the magnitude and the direction of the current in the first and the second resistors with a predetermined current value, and
concluding that a potential short exists in the first lower IGBT, the second lower IGBT, or the third lower IGBT if the magnitude of the current in at least one of the first and the second resistors is substantially zero.

26. The method of claim 25, further comprising:
during a third time interval,
turning ON the second upper IGBT,
sensing a magnitude and a direction of a current in at least one of the first and the second resistors,
comparing the magnitude and the direction of the current in the first and the second resistors with a predetermined current value,
concluding that the first lower IGBT and the third lower IGBT are shorted in response to the comparison determining that the current in the first resistor is a negative of the predetermined current value and the current in the second resistor is a positive of the predetermined current value,
concluding that the first lower IGBT is shorted in response to the comparison determining that the current in the first resistor is a negative of the predetermined current value, and
concluding that the third lower IGBT is shorted in response to the comparison determining that the current in the second resistor is a negative of the predetermined current value and the current in the first resistor is substantially zero.

27. A fault determination system for assessing a condition of a power converter circuit, the power converter circuit comprising a number N of pairs of insulated gate bipolar transistors ("IGBTs"), each pair of IGBTs comprising an upper IGBT coupled to a first polarity of a DC power source and a lower IGBT coupled to a second polarity of the DC power source, the system comprising:
means for, during a first time interval,
controlling at least one upper IGBT and at least one lower IGBT such that at least one expected current will flow through a part of a resistive network during the first time interval if the at least one upper IGBT and the at least one lower IGBT are normal,
sensing a magnitude and a direction of an actual current flowing through the part of the resistive network during the first time interval, and
comparing the sensed actual current with the expected current, and
concluding a state of at least one IGBT in response to the comparison.

28. A fault determination method for assessing a condition of a power converter circuit, the power converter circuit comprising a number N of pairs of insulated gate bipolar transistors ("IGBTs"), each pair of IGBTs comprising an upper IGBT coupled to a first polarity of a DC power source and a lower IGBT coupled to a second polarity of the DC power source, the method comprising:
during a first time interval and in response to a motor indicating a fault,
sequentially controlling at least one of the upper IGBTs and at least one of the lower IGBTs such that at least during one first-time-interval an expected current will flow through a part of motor windings if the at least one upper IGBT and the at least one lower IGBT are normal, and
sensing a magnitude and a direction of at least one first-time-interval current through the part of the motor windings, and
concluding a state of at least one IGBT in response to the sensing.

29. The method of claim 28, wherein the N pairs of IGBTs comprises a first, a second, and a third upper IGBT respectively in series connection with a first, a second, and a third lower IGBT and wherein the method further comprises:
during the first time interval and in response to the motor indicating a fault related to at least one of the first upper IGBT and the first lower IGBT,
turning ON the second upper IGBT such that if a short exists in the first lower IGBT a first current will flow through a first winding in series with a second winding, where the first winding is in series with the first upper and first lower IGBTs and the second winding is in series with both the second upper and second lower IGBTs,
sensing a magnitude and a direction of the first current in at least one of the first and the second windings, and
concluding that the first lower IGBT is shorted in response to the sensing showing that the first current in the first and the second windings has a magnitude substantially equal to an input current.

30. The method of claim 29, further comprising:
during the first time interval,
turning OFF the second upper IGBT and thereafter turning ON the second lower IGBT such that if a short exists in a first lower IGBT a second current will flow through a first winding in series with the second winding, where the first winding is in series with the first upper and first lower IGBTs and the second winding is in series with both the second upper and second lower IGBTs,
sensing a magnitude and a direction of the second current in at least one of the first and the second windings, and
concluding that the first lower IGBT is shorted in response to the sensing showing that the second current in the first and the second windings has a magnitude substantially equal to an input current.

31. The method of claim 30, further comprising:
during a second time interval,
sequentially turning ON the first upper IGBT and the second lower IGBT,
sensing a magnitude and a direction of a current in at least one of the first and the second windings, and
concluding that the first upper IGBT and the first lower IGBT are potentially normal in response to determining that the sensed currents in the first and the second windings are of equal magnitude and have magnitudes substantially equal to the input current.

32. The method of claim 31, further comprising:
during a third time interval,
sequentially turning ON the first lower IGBT and the second upper IGBT,
sensing a magnitude and a direction of a current in at least one of the first and the second windings, and
concluding that the first upper IGBT and the first lower IGBT are potentially normal in response to determining that the sensed currents in the first and the second windings are of equal magnitude and have magnitudes substantially equal to the input current.

33. The method of claim 28, wherein the N pairs of IGBTs comprises a first, a second, and a third upper IGBT respectively in series connection with a first, a second, and a third lower IGBT and wherein a first winding is in series with the first upper and the first lower IGBTs and a node, a second winding in series with the second upper and the second lower IGBTs and the node, and a third winding in series with the node and the third upper and the third lower IGBTs, and wherein the method further comprises:
during the first time interval and in response to the motor indicating a fault related to at least one of the first upper IGBT, the first lower IGBT, the third upper IGBT, and the third lower IGBT, sequentially turning ON the second upper IGBT and the second lower IGBT, sensing a magnitude and a direction of a current in at least one of the first and the second windings, and concluding that the first lower IGBT is shorted in response to determining that the sensed currents in the first and the second windings are of equal magnitude and have magnitudes substantially equal to an input current, concluding that the first lower IGBT and the third lower IGBT are shorted in response to determining that the sensed current in the second winding is twice the magnitude of the current in the first winding, concluding that the third lower IGBT is shorted in response to determining that the sensed current in the second winding has a magnitude substantially equal to the input current and that the current in the first winding has substantially zero magnitude.

34. The method of claim 33, further comprising:

during a second time interval, sequentially turning ON the first upper IGBT and the second lower IGBT, sensing a magnitude and a direction of a current in at least one of the first and the second windings, and concluding that the first upper IGBT and the first lower IGBT are potentially normal in response to determining that the sensed currents in the first and the second windings are of equal magnitude and have magnitudes substantially equal to the input current.

35. The method of claim 34, further comprising:

during a third time interval, sequentially turning ON the first lower IGBT and the second upper IGBT, sensing a magnitude and a direction of a current in at least one of the first and the second windings, and concluding that the first upper IGBT and the first lower IGBT are normal in response to determining that the sensed currents in the first and the second windings are of equal magnitude and have magnitudes substantially equal to the input current.

36. The method of claim 35, further comprising:

during a fourth time interval, sequentially turning ON the third upper IGBT and the second lower IGBT, sensing a magnitude and a direction of a current in at least one of the first and the second windings, and concluding that the third upper IGBT and the third lower IGBT are potentially normal in response to determining that the sensed currents in the first and the second windings are of equal magnitude and have magnitudes substantially equal to the input current.

37. The method of claim 36, further comprising:

during a fifth time interval, sequentially turning ON the third lower IGBT and the second upper IGBT, sensing a magnitude and a direction of a current in at least one of the first and the second windings, and concluding that the third upper IGBT and the third lower IGBT are normal in response to determining that the sensed currents in the first and the second windings are of equal magnitude and have magnitudes substantially equal to the input current.

38. A fault determination system for assessing a condition of a power converter circuit, the power converter circuit comprising a number N of pairs of insulated gate bipolar transistors ("IGBTs"), each pair of IGBTs comprising an upper IGBT coupled to a first polarity of a DC power source and a lower IGBT coupled to a second polarity of the DC power source, the system comprising:

means for, during a first time interval and in response to a motor indicating a fault, sequentially controlling at least one upper IGBT and at least one lower IGBT according to a duty cycle that would pass an expected current through a part of motor windings during the first time interval if the at least one upper IGBT and the at least one lower IGBT are normal, and sensing a magnitude and a direction of an actual current passing through the part of the motor windings during the first time interval, and comparing the actual current sensed during the first time interval with the current expected during the first time interval, and concluding a state of at least one IGBT in response to the comparison.

* * * * *